US012265379B2

United States Patent
Sanghvi et al.

(10) Patent No.: US 12,265,379 B2
(45) Date of Patent: Apr. 1, 2025

(54) METHODS AND MECHANISMS FOR ADJUSTING FILM DEPOSITION PARAMETERS DURING SUBSTRATE MANUFACTURING

(71) Applicant: Applied Materials, Inc., Santa Clara, CA (US)

(72) Inventors: Mitesh Sanghvi, Dublin, CA (US); Venkatanarayana Shankarmurthy, San Jose, CA (US); Yulian Yao, Santa Clara, CA (US); Chuan Ying Wang, San Jose, CA (US); Xinhai Han, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 281 days.

(21) Appl. No.: 17/737,318

(22) Filed: May 5, 2022

(65) Prior Publication Data

US 2023/0359179 A1 Nov. 9, 2023

(51) Int. Cl.
*G05B 19/418* (2006.01)
*C23C 16/455* (2006.01)
*C23C 16/52* (2006.01)

(52) U.S. Cl.
CPC .. *G05B 19/41865* (2013.01); *C23C 16/45525* (2013.01); *C23C 16/52* (2013.01);
(Continued)

(58) Field of Classification Search
CPC .... G05B 19/41865; G05B 2219/31443; C23C 16/52; C23C 16/45525
(Continued)

(56) References Cited

U.S. PATENT DOCUMENTS

| 6,511,898 B1 * | 1/2003 | Sonderman | H01L 22/26 438/301 |
| 6,512,991 B1 * | 1/2003 | Davis | G01K 7/42 374/E7.042 |

(Continued)

FOREIGN PATENT DOCUMENTS

| EP | 3105780 B1 * | 4/2022 | G06T 7/0004 |
| WO | WO-2020049911 A1 * | 3/2020 | G01B 11/06 |
| WO | WO-2021205445 A1 * | 10/2021 | G01N 21/9501 |

OTHER PUBLICATIONS

International Search Report and Written Opinion for International Application No. PCT/US2023/020985, mailed May 25, 2023, 9 Pages.

*Primary Examiner* — Ronald D Hartman, Jr.
(74) *Attorney, Agent, or Firm* — Lowenstein Sandler LLP

(57) ABSTRACT

An electronic device manufacturing system capable of obtaining metrology data associated with a deposition process performed on a substrate according to a process recipe, wherein the deposition process generates a plurality of layers on a surface of the substrate. The manufacturing system can further obtain an expected profile associate with the process recipe, wherein the expected profile comprises a plurality of values indicative of a desired thickness for a plurality of layers of the process recipe. The manufacturing system can further generate a correction profile based on the metrology data and the expected profile, wherein the correction profile comprises a deposition time offset value for at least one layer of the plurality of layers. The manufacturing system can further generate an updated process recipe by applying the correction profile to the process recipe and cause a deposition step to be performed on the substrate according to the updated process recipe.

20 Claims, 8 Drawing Sheets

(52) U.S. Cl.
CPC ............. *G05B 2219/31443* (2013.01); *G05B 2219/45031* (2013.01)

(58) Field of Classification Search
USPC ........................................................ 700/121
See application file for complete search history.

(56) References Cited

U.S. PATENT DOCUMENTS

| | | | |
|---|---|---|---|
| 6,570,228 B1* | 5/2003 | Fuselier ................. | H01L 22/12 257/E21.53 |
| 6,728,591 B1 | 4/2004 | Hussey, Jr. et al. | |
| 6,794,299 B1* | 9/2004 | Markle ................... | H01L 22/20 257/E21.582 |
| 9,727,049 B2* | 8/2017 | Ho ...................... | G05B 19/4065 |
| 2003/0049376 A1 | 3/2003 | Schwarm et al. | |
| 2003/0129774 A1* | 7/2003 | Christian ............... | H01L 22/20 257/E21.585 |
| 2006/0015206 A1 | 1/2006 | Funk et al. | |
| 2006/0184264 A1* | 8/2006 | Willis ................. | G05B 19/4184 700/110 |
| 2007/0238201 A1* | 10/2007 | Funk ...................... | H01L 22/12 257/E21.53 |
| 2013/0150997 A1* | 6/2013 | Tsai ....................... | H01L 22/20 700/121 |
| 2022/0035979 A1 | 2/2022 | Moffatt et al. | |
| 2022/0066411 A1 | 3/2022 | Ummethala et al. | |

\* cited by examiner

METHODS AND MECHANISMS FOR ADJUSTING FILM DEPOSITION PARAMETERS DURING SUBSTRATE MANUFACTURING

TECHNICAL FIELD

The present disclosure relates to electrical components, and, more particularly, to methods and mechanisms adjusting film deposition parameters during substrate manufacturing.

BACKGROUND

Products can be produced by performing one or more manufacturing processes using manufacturing equipment. For example, semiconductor manufacturing equipment can be used to produce semiconductor devices (e.g., substrates) via semiconductor manufacturing processes. The manufacturing equipment can, according to a process recipe, deposit multiple layers of film on the surface of the substrate and can perform an etch process to form the intricate pattern in the deposited film. For example, the manufacturing equipment can perform a chemical vapor deposition (CVD) process to deposit alternative layers on the substrate. During this substrate manufacturing process, due to continuously changing deposition parameters and variations in process chamber conditions (e.g., build-up of contaminant, erosion on certain components, etc.), the thickness of each layer can vary. Compensating for these variation is generally performed by manually increasing or decreasing the deposition time of subsequent layers to maintain a desired overall thickness of the film stack. However, such a process is error prone and can resulting in delays in manufacturing and a defective product. Therefore, a system capable of automatically adjusting film deposition parameters is desirable.

SUMMARY

The following is a simplified summary of the disclosure in order to provide a basic understanding of some aspects of the disclosure. This summary is not an extensive overview of the disclosure. It is intended to be neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system is capable of obtaining metrology data associated with a deposition process performed on a substrate according to a process recipe, wherein the deposition process generates a plurality of layers on a surface of the substrate. The manufacturing system can further obtain an expected profile associate with the process recipe, wherein the expected profile comprises a plurality of values indicative of a desired thickness for a plurality of layers of the process recipe. The manufacturing system can further generate a correction profile based on the metrology data and the expected profile, wherein the correction profile comprises a deposition time offset value for at least one layer of the plurality of layers. The manufacturing system can further generate an updated process recipe by applying the correction profile to the process recipe and cause a deposition step to be performed on the substrate according to the updated process recipe.

A further aspect of the disclosure includes a method according to any aspect or embodiment described herein.

A further aspect of the disclosure includes a non-transitory computer-readable storage medium comprising instructions that, when executed by a processing device operatively coupled to a memory, performs operations according to any aspect or embodiment described herein.

BRIEF DESCRIPTION OF THE DRAWINGS

The present disclosure is illustrated by way of example, and not by way of limitation in the figures of the accompanying drawings.

DETAILED DESCRIPTION

Figure 1:
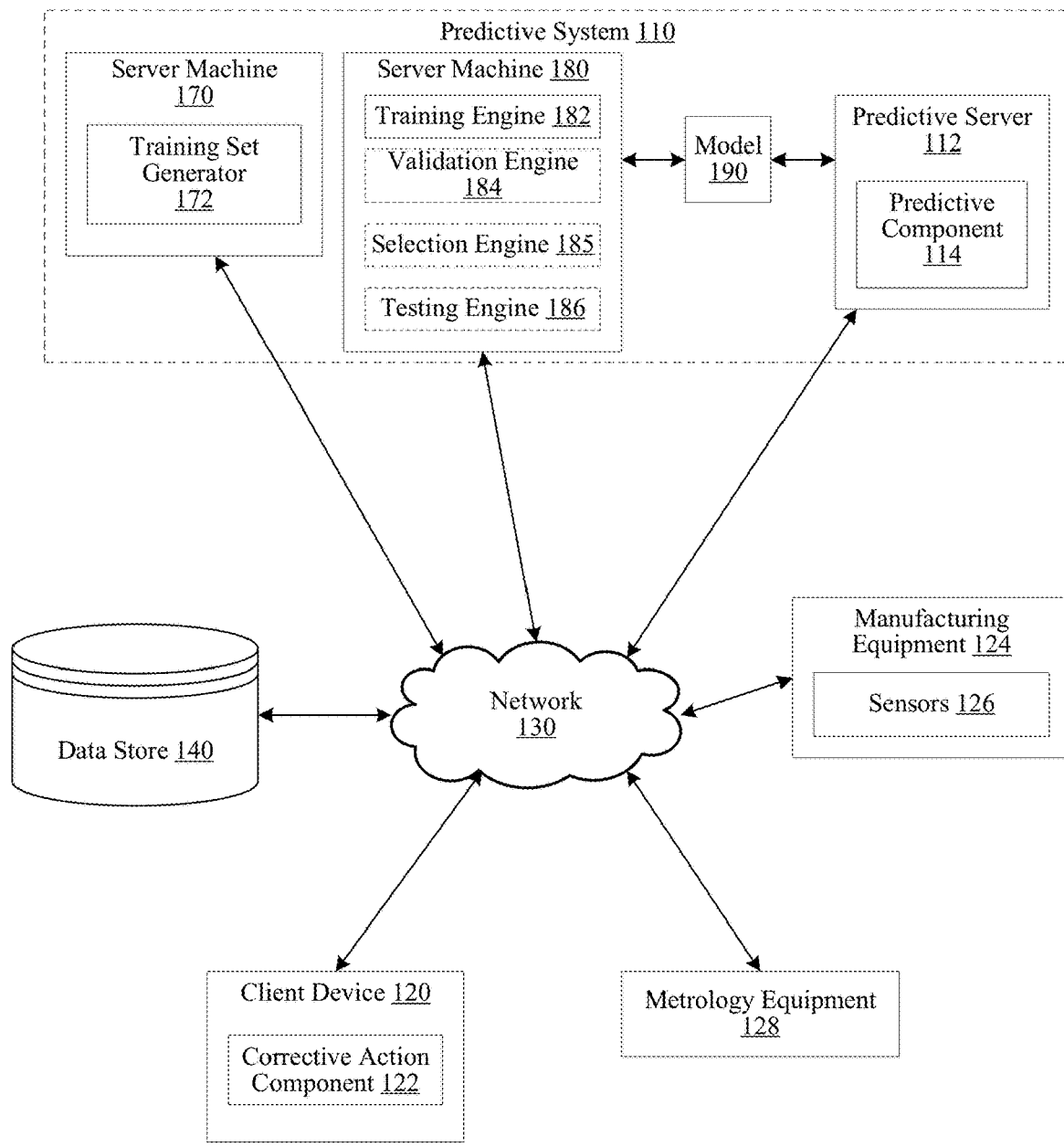
FIG. 1 is a block diagram illustrating an example system architecture, according to certain embodiments.

Described herein are technologies directed to methods and mechanisms for adjusting film deposition parameters during substrate manufacturing. A film can be deposited on a surface of a substrate during a deposition process (e.g., a deposition (CVD) process, an atomic layer deposition (ALD) process, and so forth) performed at a process chamber of a manufacturing system. For example, in a CVD process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer can be formed directly on the surface of the substrate (referred to as a proximal layer or proximal end of the film) and have a first thickness. After the first layer is formed on the surface of the substrate, a second layer having a second thickness can be formed on the first layer. This process continues until the deposition process is completed and a final layer is formed for the film (referred to as the distal layer or distal end of the film). The film can include alternating layers of different materials. For example, the film can include alternating layers of oxide and nitride layers (oxide-nitride-oxide-nitride stack or ONON stack), alternating oxide and polysilicon layers (oxide-polysilicon-oxide-polysilicon stack or OPOP stack), and so forth. Each set of alternating layers can be referred to as a loop. For example, a film can include 40 loops (e.g., 40 sets of oxide-nitride layers).

The film can be subjected to, for example, an etch process to form a pattern on the surface of the substrate, a chemicalmechanical polishing (CMP) process to smooth the surface of the film, or any other process necessary to manufacture the finished substrate. An etch process can include exposing highly energetic process gas (e.g., a plasma) with a sample surface to break down the materials at the surface, which can then be removed by a vacuum system.

A process chamber can perform each substrate manufacturing process (e.g., the deposition process, the etch process, the polishing process, etc.) according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc. Accordingly, the thickness of each film layer can be correlated to these process chamber settings.

Generally, a process recipe includes a set of loops (e.g., 40 loops) where the thickness of the layers of some loops can be different than those of other loops. For example, a film stack can include 40 oxide-nitride loops (e.g., 80 layers, alternating 40 layers of oxide and 40 layers of nitride), where the first loop of the film stack has an oxide layer of a first thickness and a nitride layer of a second thickness, then next nine loops of the film stack having oxide layers of a third thickness and nitride layers of a fourth thickness, and the final 30 loops of the film stack having oxide layers of a fifth thickness and nitride layers of a sixth thickness.

During the substrate manufacturing process, due to continuously changing deposition parameters and variations in process chamber conditions (e.g., build-up of contaminant, erosion on certain components, etc.), the thickness of each loop can vary. The variations in layer thickness can cause the gas distribution plate to be nearer or farther from the surface of the substrate, thus affecting the plasma flow and/or temperature, and causing further deformations to the film. In some manufacturing systems, these variations are compensated for by manually increasing or decreasing the deposition time of subsequent loops to maintain a desired overall thickness of the film stack. For example, if the first loop has a greater thickness than required by the process recipe, a technician can manually decrease the deposition time of the second loop in the process recipe to generate a thinner loop than required by the process recipe. This manual process of calculating "step time offsets" for each loop and feeding the offsets into tables can be a time consuming and error prone process, resulting in delays in manufacturing, a loss of throughput and/or defects in the film.

Aspects and implementations of the present disclosure address these and other shortcomings of the existing technology by generating correction profiles to adjust film deposition parameters during substrate manufacturing. In particular, metrology equipment can generate metrology data for a substrate before, during, and/or after a manufacturing process (e.g., a deposition process) based on a process recipe. The metrology equipment can use the metrology data to generate a thickness profile indicative of one or more thickness values across the surface of the substrate. The thickness profile can indicate the thickness of the film on the substrate. The metrology equipment can generate the thickness profiles at different times during the manufacturing process. For example, the metrology equipment can generate metrology data after the deposition of each layer of a film stack, after the deposition of each loop of a film stack, etc.

The manufacturing system can obtain an expected profile for the process recipe. The expected profile can include the values indicative of desired thickness of the film, the desired thickness of one or more layers of the film, and/or the desired thickness of one or more loops of the film. Using the thickness profile and the expected profile, the manufacturing system can generate a correction profile. The correction profile can include one or more adjustments or offsets (e.g., corrective actions) to be applied to the parameters of the process recipe or the process chamber. For example, the correction profile can include an adjustment, for a particular layer or loop of the process recipe, to the deposition time, to the temperature setting for the process chamber, to the pressure setting for the process chamber, to the flow rate setting for a precursor, to the power supplied to the process chamber, to the ratio of two or more settings, etc. In some embodiments, the manufacturing system can generate the correction profiles by using one or more formulas or mathematical models. For example, the processing logic can use the data values from the expected profile and/or thickness profile to generate a curve fitting model, then use the curve fitting model to determine one or more offset time values for one or more steps of a current deposition process. An offset can be applied to each deposition step to adjust the layer thickness of the step such that the film thickness at the conclusion of the deposition is the same as the film thickness indicated by the process recipe.

In some embodiments, the processing logic can generate the correction profile using a machine-learning model or using an inference engine. The manufacturing system can then use the correction profile to adjust a process recipe parameter (e.g., a deposition time) for one or more steps of the process recipe (e.g., for one or more layers or loops of the process recipe). This allows the manufacturing system to generate adjustments for particular process steps of a process recipe.

Aspects of the present disclosure result in technological advantages of significant reduction in time needed to perform an optimization of the parameters of a process recipe. Aspects of the present disclosure further result in technological advantages of significant reduction in time needed to detect issues or failures experienced by a substrate during the manufacturing process, as well as improvements in energy consumption, and so forth. The present disclosure can also result in generating diagnostic data and performing corrective actions to avoid inconsistent and abnormal products, and unscheduled user time or down time.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 126 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber, such as process chamber 400 described with respect to FIG. 4. Manufacturing equipment 124 can perform a process for a substrate (e.g., a wafer, etc.) at the process chamber. Examples of substrate processes include a deposition process to deposit one or more layers of film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 includes sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process) is performed for the substrate. In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3 and FIG. 4.

In some embodiments, sensors 126 provide sensor data (e.g., sensor values, features, trace data) associated with manufacturing equipment 124 (e.g., associated with producing, by manufacturing equipment 124, corresponding products, such as wafers). The manufacturing equipment 124 can produce products following a recipe or by performing runs over a period of time. Sensor data received over a period of time (e.g., corresponding to at least part of a recipe or run) can be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

In some embodiments, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In some instances, metrology equipment 128 can be referred to as in-situ metrology equipment. In another example, metrology equipment 128 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system. The client device 120 can include a corrective action component 122. Corrective action component 122 can receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data) from the predictive system 110, determines a corrective action based on the output, and causes the corrective action to be implemented. In some embodiments, the corrective action component 122 receives an indication of a corrective action from the predictive system 110 and causes the corrective action to be implemented. Each client device 120 can include an operating system that allows users to one or more of generate, view, or edit data (e.g., indication associated with manufacturing equipment 124, corrective actions associated with manufacturing equipment 124, etc.).

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

The data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

The data store 140 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some embodiments, data store 140 can store expected profiles, thickness profiles, and corrections profiles. An expected profile can include one or more data points associated with a desired film profile expected to be produced by a certain process recipe. In some embodiments, an expected profile can include the desired thickness of the film, the desired thickness of one or more layers of the film, and/or the desired thickness of one or more loops of the film, etc. The thickness profile include one or more data points associated with the current film profile generated by the manufacturing equipment 124. For example, the thickness profile can include the measured thickness of the film, the measured thickness of one or more layers of the film, and/or the measured thickness of one or more loops of the film, etc. The thickness profile can be measured using metrology equipment 128. The correction profile can include one or more adjustments or offsets to be applied to the parameters of the process chamber or the process recipe. For example, the correction profile can include an adjustment to the deposition time for a film layer and/or a loop, the temperature setting for the process chamber, the pressure setting for the process chamber, the flow rate setting for a precursor for a material included in the film deposited on the substrate surface, to the power supplied to the process chamber, to the ratio of two or more settings, etc. The correction profiles can be generated by comparing the expected profile (e.g., the thickness profile expected to be generated by the process recipe), and determining, using an algorithm, a library of known fault patterns, etc., the adjustment to be applied to the parameters of the process recipe to achieve the expected profile. The correction profiles can be applied to steps associated with the deposition process, the etch process, etc.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, data store 140 can be configured to store data associated with known fault patterns. A fault pattern can be a one or more values (e.g., a vector, a scalar, etc.) associated with one or more issues or failures associated with a process chamber sub-system. In some embodiments, a fault pattern can be associated with a corrective action. For example, a fault pattern can include parameter adjustment steps to correct the issue or failure indicated by the fault pattern. For example, the predictive system can compare a determined fault pattern to a library of known fault patterns to determine the type of failure experienced by a sub-system, the cause of the failure, the recommended corrective action to correct the fault, and so forth.

In some embodiments, predictive system 110 includes predictive server 112, server machine 170 and server machine 180. The predictive server 112, server machine 170, and server machine 180 can each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 that is capable of generating training data sets (e.g., a set of data inputs and a set of target outputs) to train, validate, and/or test a machine-learning model 190. Machine-learning model 190 can be any algorithmic model capable of learning from data. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training one or more machine-learning models 190. Machine-learning model 190 can refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the machine-learning model 190 that captures these patterns. The machine-learning model 190 can use one or more of a statistical modelling, support vector machine (SVM), Radial Basis Function (RBF), clustering, supervised machine-learning, semi-supervised machine-learning, unsupervised machine-learning, k-nearest neighbor algorithm (k-NN), linear regression, random forest, neural network (e.g., artificial neural network), etc.

One type of machine learning model that can be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities can be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks can learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input can be process result profiles (e.g., thickness profiles indicative of one or more thickness values across a surface of a substrate); the second layer can compose feature data associated with a status of one or more zones of controlled elements of a plasma process system (e.g., orientation of zones, plasma exposure duration, etc.); the third layer can include a starting recipe (e.g., a recipe used as a starting point for determining an updated process recipe the process a substrate to generate a process result the meets threshold criteria). Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs can be that of the network and can be the number of hidden layers plus one. For recurrent neural networks, in which a signal can propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs can be trained using a training dataset to generate a fixed number of outputs (e.g., to determine a set of substrate processing rates, determine modification to a substrate process recipe). One type of RNN that can be used is a long short term memory (LSTM) neural network.

Training of a neural network can be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

A training dataset containing hundreds, thousands, tens of thousands, hundreds of thousands or more sensor data and/or process result data (e.g., metrology data such as one or more thickness profiles associated with the sensor data) can be used to form a training dataset.

To effectuate training, processing logic can input the training dataset(s) into one or more untrained machine learning models. Prior to inputting a first input into a machine learning model, the machine learning model can be initialized. Processing logic trains the untrained machine learning model(s) based on the training dataset(s) to generate one or more trained machine learning models that perform various operations as set forth above. Training can be performed by inputting one or more of the sensor data into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine learning model can produce.

Accordingly, the output can include one or more predictions or inferences. For example, an output prediction or inference can include one or more predictions of film buildup on chamber components, erosion of chamber components, predicted failure of chamber components, and so on. Processing logic determines an error (i.e., a classification error) based on the differences between the output (e.g., predictions or inferences) of the machine learning model and target labels associated with the input training data. Processing logic adjusts weights of one or more nodes in the machine learning model based on the error. An error term or delta can be determined for each node in the artificial neural network. Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy can be, for example, 70%, 80% or 90% accuracy. In one embodiment, the stopping criterion is met if accuracy of the machine learning model has stopped improving. If the stopping criterion has not been met, further training is performed. If the stopping criterion has been met, training can be complete. Once the machine learning model is trained, a reserved portion of the training dataset can be used to test the model.

Once one or more trained machine learning models 190 are generated, they can be stored in predictive server 112 as predictive component 114 or as a component of predictive component 114.

The validation engine 184 can be capable of validating machine-learning model 190 using a corresponding set of features of a validation set from training set generator 172. Once the model parameters have been optimized, model validation can be performed to determine whether the model has improved and to determine a current accuracy of the deep learning model. The validation engine 184 can determine an accuracy of machine-learning model 190 based on the corresponding sets of features of the validation set. The validation engine 184 can discard a trained machine-learning model 190 that has an accuracy that does not meet a threshold accuracy. In some embodiments, the selection engine 185 can be capable of selecting a trained machine-learning model 190 that has an accuracy that meets a threshold accuracy. In some embodiments, the selection engine 185 can be capable of selecting the trained machine-learning model 190 that has the highest accuracy of the trained machine-learning models 190.

The testing engine 186 can be capable of testing a trained machine-learning model 190 using a corresponding set of features of a testing set from data set generator 172. For example, a first trained machine-learning model 190 that was trained using a first set of features of the training set can be tested using the first set of features of the testing set. The testing engine 186 can determine a trained machine-learning model 190 that has the highest accuracy of all of the trained machine-learning models based on the testing sets.

As described in detail below, predictive server 112 includes a predictive component 114 that is capable of providing generating a correction profile using one or more formulas, and/or running trained machine-learning model 190 on the current sensor data input to obtain one or more outputs indicative of correction or adjustment data (e.g., deposition time adjustment data for each layer and/or loop of a process recipe).

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
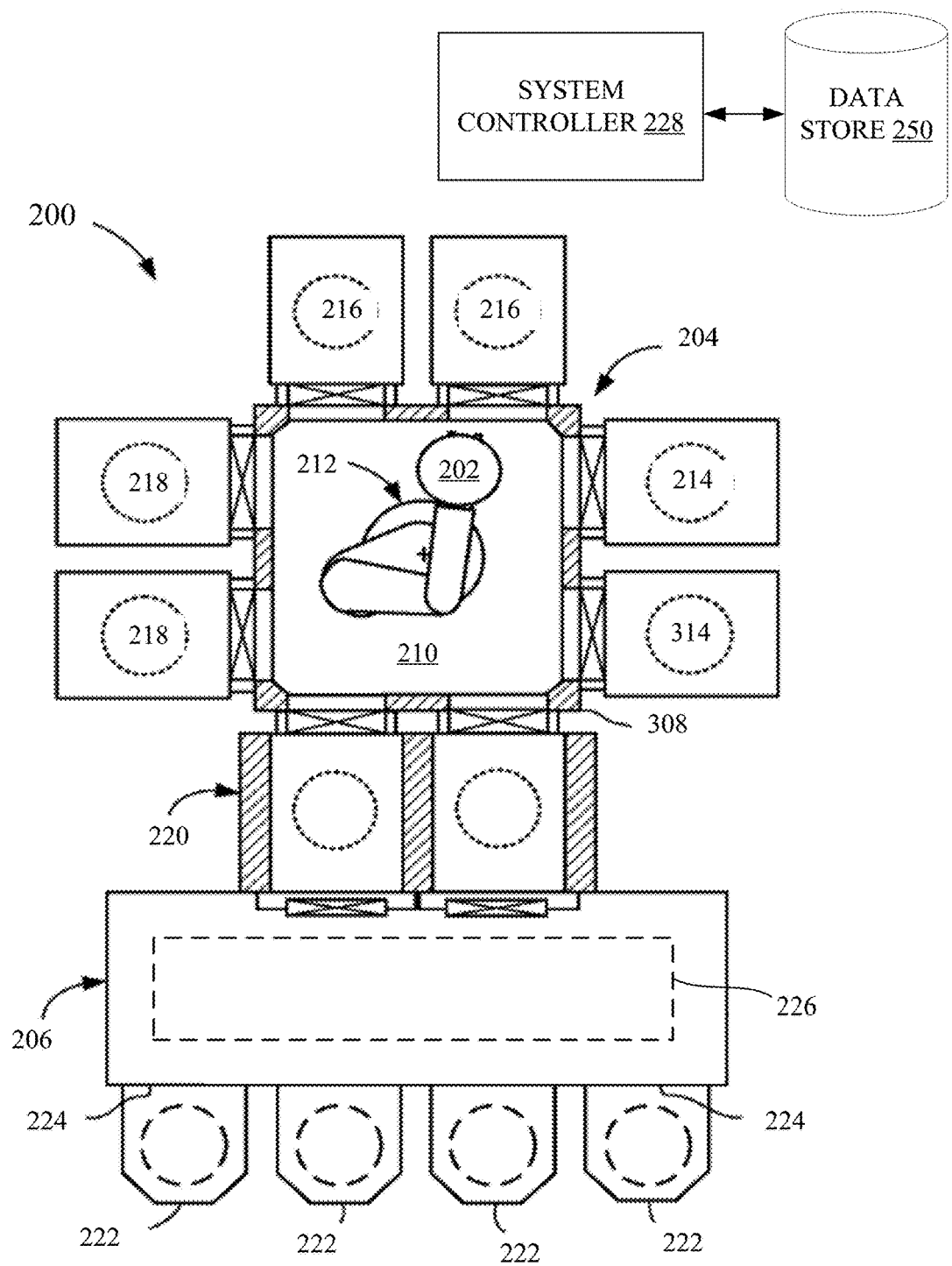
FIG. 2 is a top schematic view of an example manufacturing system, according to certain embodiments.

In some embodiments, a manufacturing system can include more than one process chambers. For example, example manufacturing system 200 of FIG. 2 illustrates multiple process chambers 214, 216, 218. It should be noted that, in some embodiments, data obtained to train the machine-learning model and data collected to be provided as input to the machine-learning model can be associated with the same process chamber of the manufacturing system. In other or similar embodiments, data obtained to train the machine-learning model and data collected to be provided as input to the machine-learning model can be associated with different process chambers of the manufacturing system. In other or similar embodiments, data obtained to train the machine-learning model can be associated with a process chamber of a first manufacturing system and data collected to be provide as input to the machine-learning model can be associated with a process chamber of a second manufacturing system.

FIG. 2 is a top schematic view of an example manufacturing system 200, according to aspects of the present disclosure. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 200 can include a process tool 204 and a factory interface 206 coupled to process tool 204. Process tool 204 can include a housing 208 having a transfer chamber 210 therein. Transfer chamber 210 can include one or more process chambers (also referred to as processing chambers) 214, 216, 218 disposed therearound and coupled thereto. Process chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers, sensor discs, sensor tools, etc.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 214, 216, 218 can each include one or more sensors configured to capture data for substrate 202 before, after, or during a substrate process. For example, the one or more sensors can be configured to capture spectral data and/or non-spectral data for a portion of substrate 202 during a substrate process. In other or similar embodiments, the one or more sensors can be configured to capture data associated with the environment within process chamber 214, 216, 218 before, after, or during the substrate process. For example, the one or more sensors can be configured to capture data associated with a temperature, a pressure, a gas concentration, etc. of the environment within process chamber 214, 216, 218 during the substrate process.

A load lock 220 can also be coupled to housing 208 and transfer chamber 210. Load lock 220 can be configured to interface with, and be coupled to, transfer chamber 210 on one side and factory interface 206. Load lock 220 can have an environmentally-controlled atmosphere that can be changed from a vacuum environment (wherein substrates can be transferred to and from transfer chamber 210) to an at or near atmospheric-pressure inert-gas environment (wherein substrates can be transferred to and from factory interface 206) in some embodiments. Factory interface 206 can be any suitable enclosure, such as, e.g., an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between carriers (also referred to as containers) 222 and load lock 220. Carriers 222 can be a substrate storage carrier or a replacement part storage carrier.

Manufacturing system 200 can also be connected to a client device (not shown) that is configured to provide information regarding manufacturing system 200 to a user (e.g., an operator). In some embodiments, the client device can provide information to a user of manufacturing system 200 via one or more graphical user interfaces (GUIs). For example, the client device can provide information regarding a target thickness profile for a film to be deposited on a surface of a substrate 202 during a deposition process performed at a process chamber 214, 216, 218 via a GUI. The client device can also provide information regarding a modification to a process recipe in view of a respective set of deposition settings predicted to correspond to the target profile, in accordance with embodiments described herein.

Manufacturing system 200 can also include a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 200 in accordance with a process recipe. The instructions can be stored on a computer readable storage medium, which can include the main memory, static memory, secondary storage and/or processing device (during execution of the instructions).

System controller 228 can receive data from sensors included on or within various portions of manufacturing system 200 (e.g., processing chambers 214, 216, 218, transfer chamber 210, load lock 220, etc.). In some embodiments, data received by the system controller 228 can include spectral data and/or non-spectral data for a portion of substrate 202. In other or similar embodiments, data received by the system controller 228 can include data associated with processing substrate 202 at processing chamber 214, 216, 218, as described previously. For purposes of the present description, system controller 228 is described as receiving data from sensors included within process chambers 214, 216, 218. However, system controller 228 can receive data from any portion of manufacturing system 200 and can use data received from the portion in accordance with embodiments described herein. In an illustrative example, system controller 228 can receive data from one or more sensors for process chamber 214, 216, 218 before, after, or during a substrate process at the process chamber 214, 216, 218. Data received from sensors of the various portions of manufacturing system 200 can be stored in a data store 250. Data store 250 can be included as a component within system controller 228 or can be a separate component from system controller 228. In some embodiments, data store 250 can be data store 140 described with respect to FIG. 1.

Figure 3:
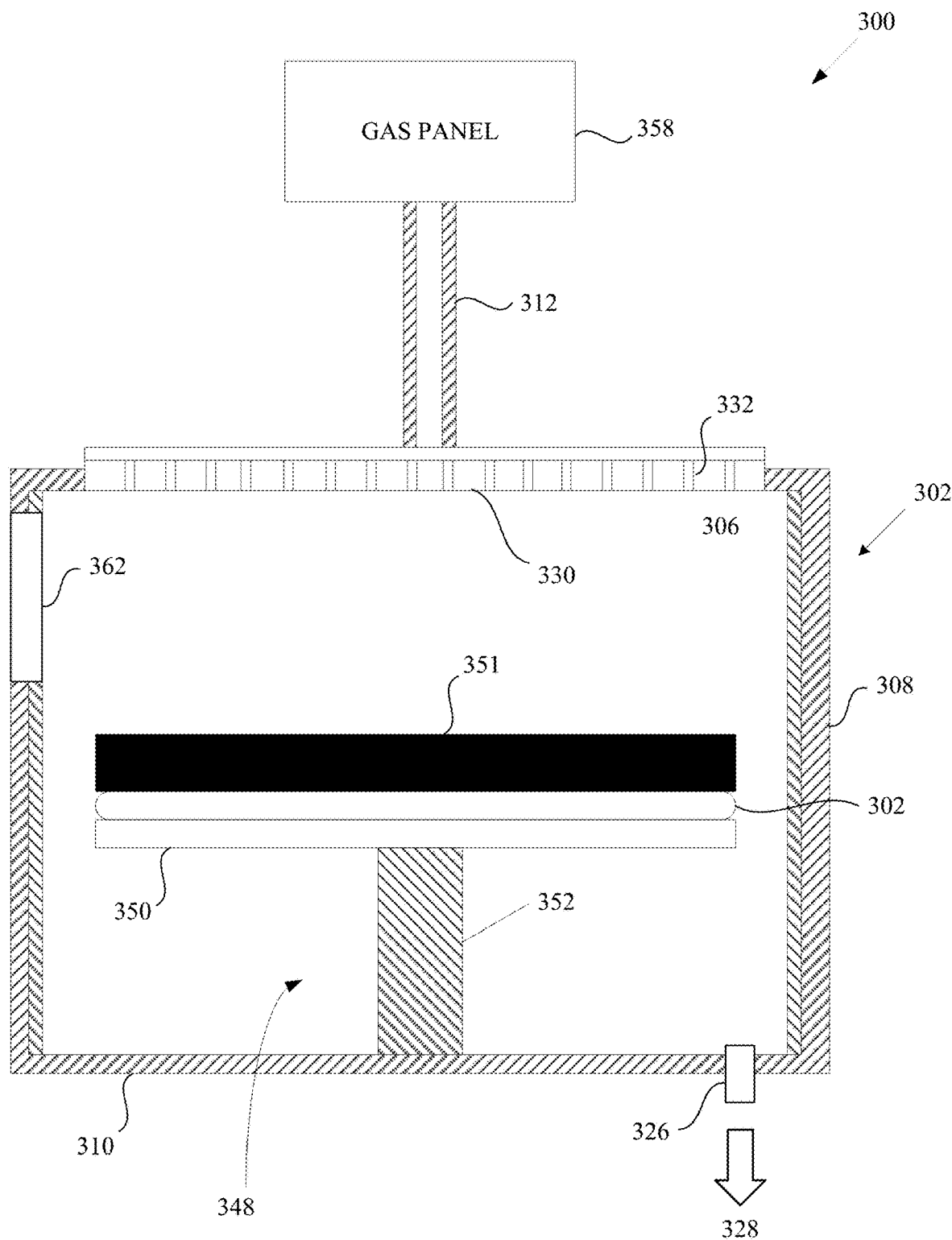
FIG. 3 is a cross-sectional schematic side view of an example process chamber of the example manufacturing system, according to certain embodiments.

FIG. 3 is a cross-sectional schematic side view of a process chamber 300, in accordance with embodiments of the present disclosure. In some embodiments, process chamber 300 can correspond to process chamber 214, 216, 218, described with respect to FIG. 2. Process chamber 300 can be used for processes in which a corrosive plasma environment is provided. For example, the process chamber 300 can be a chamber for a plasma etcher or plasma etch reactor, and so forth. In another example, process chamber can be a chamber for a deposition process, as previously described. In one embodiment, the process chamber 300 includes a chamber body 302 and a showerhead 330 that encloses an interior volume 306. The showerhead 330 can include a showerhead base and a showerhead gas distribution plate. Alternatively, the showerhead 330 can be replaced by a lid and a nozzle in some embodiments, or by multiple pie shaped showerhead compartments and plasma generation units in other embodiments. The chamber body 302 can be fabricated from aluminum, stainless steel or other suitable material such as titanium (Ti). The chamber body 302 generally includes sidewalls 308 and a bottom 310. An exhaust port 326 can be defined in the chamber body 302, and can couple the interior volume 306 to a pump system 328. The pump system 328 can include one or more pumps and throttle valves utilized to evacuate and regulate the pressure of the interior volume 306 of the process chamber 300.

The showerhead 330 can be supported on the sidewall 308 of the chamber body 302. The showerhead 320 (or lid) can be opened to allow access to the interior volume 306 of the process chamber 300, and can provide a seal for the process chamber 300 while closed. A gas panel 358 can be coupled to the process chamber 300 to provide process and/or cleaning gases to the interior volume 306 through the showerhead 330 or lid and nozzle (e.g., through apertures of the showerhead or lid and nozzle). For example. gas panel 358 can provide precursors for materials of a film 351 deposited on a surface of a substrate 302. In some embodiments, a precursor can include a silicon-based precursor or a boron-based precursor. The showerhead 330 can include a gas distribution plate (GDP) and can have multiple gas delivery holes 332 (also referred to as channels) throughout the GDP. A substrate support assembly 348 is disposed in the interior volume 306 of the process chamber 300 below the showerhead 330. The substrate support assembly 348 holds a substrate 302 during processing (e.g., during a deposition process) using, for example, electrostatic chuck 350.

In some embodiments, processing chamber 300 can include metrology equipment (not shown) configured to generate in-situ metrology measurements during a process performed at process chamber 300. The metrology equipment can be operatively coupled to the system controller (e.g., system controller 328, as previously described). In some embodiments, the metrology equipment can be configured to generate a metrology measurement value (e.g., a thickness) for film 351 during particular instances of the deposition process. The system controller can generate a thickness profile for film 351 based on the received metrology measurement values from the metrology equipment. In other or similar embodiments, processing chamber 300 does not include metrology equipment. In such embodiments, the system controller can receive one or more metrology measurement values for film 351 after completion of the deposition process at process chamber 300. System controller can determine a deposition rate based on the one or more metrology measurement values and can associate generate the thickness profile for film 351 based on the determined concentration gradient and the determined deposition rate of the deposition process.

Figure 4:
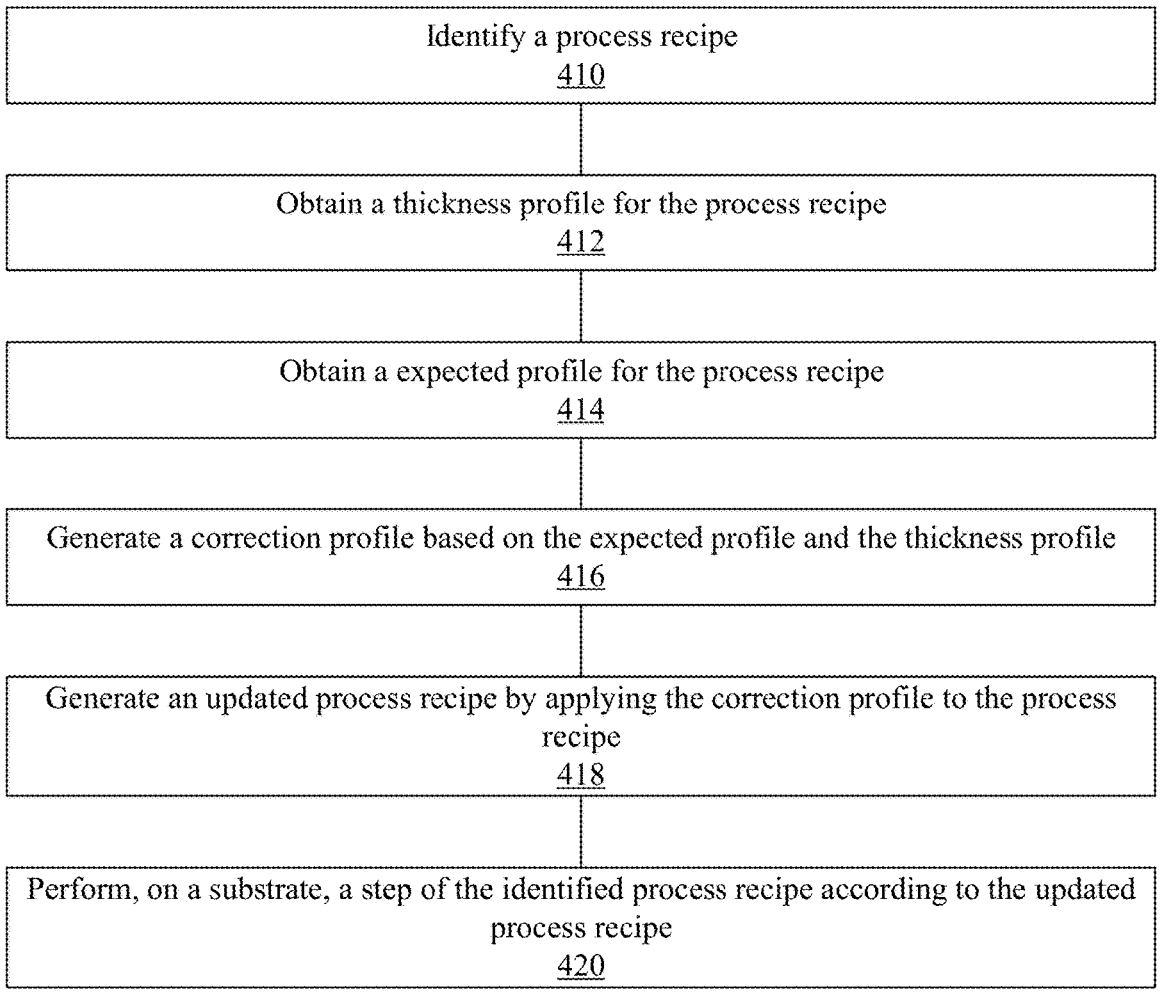
FIG. 4 is a flow chart of a method for adjusting a process recipe based on a correction profile, according to certain embodiments.

FIG. 4 is a flow chart of a method 400 for adjusting a process recipe based on a correction profile, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by manufacturing equipment 124 and/or client device 122.

At operation 410, the processing logic identifies a process recipe. In some embodiments, the processing logic can receive user input identifying the process recipe. In other embodiments, the processing logic can automatically select a process recipe. For example, the processing logic can identify a process recipe for which at least one process run concluded and for which a thickness profile has been generated. In yet another embodiment, the processing logic can identify the process recipe based on a currently executing process recipe. For example, the processing logic can perform a deposition process on a substrate according to a process recipe. The deposition process can be performed in one or more process chambers. The process recipe can include one or more setting parameters for the deposition process. For example, the setting parameters can include deposition time for each layer and/or loop of the process recipe, a temperature setting for the process chamber, a pressure setting for the process chamber, a flow rate setting for a precursor for a material included in the film deposited on the substrate surface, a showerhead height, etc. The deposition process can deposit multiple layers on the substrate. For example, the deposition process can deposit alternating layers of oxide and nitride layers, alternating oxide and polysilicon layers, etc.

At operation 412, the processing logic obtains a thickness profile for the process recipe. The thickness profile include one or more data values associated with a film generated by the manufacturing equipment 124. For example, the thickness profile can include the measured thickness of the film, the measured thickness of one or more layers of the film, and/or the measured thickness of one or more loops of the film, etc. The thickness profile can be measured using metrology equipment 128. In some embodiments, the thickness profile is retrieved from data store 140.

At operation 414, the processing logic obtains an expected profile for the process recipe. The expected profile can include the desired thickness of the film, the desired thickness of one or more layers of the film, and/or the desired thickness of one or more loops of the film, etc. In some embodiments, the expected profile is retrieved from data store 140.

At operation 416, the processing logic generates a correction profile based on the expected profile and the thickness profile. The correction profile can include one or more corrective actions to be applied to the parameters of the process recipe or the process chamber during one or more steps of the process recipe. In particular, the correction profile can include adjustments to the deposition time of each of one or more layers and/or one or more loops, to a temperature setting for the process chamber, a pressure setting for the process chamber, to a flow rate setting for a precursor for a material included in the film deposited on the substrate surface, to the power supplied to the process chamber, to the ratio of two or more settings, etc. For example, the correction profile can include deposition time adjustments for a loop of the process recipe. In some embodiments, the correction profile can include a set of parameter adjustments for each layer and/or loop of the process recipe. For example, the correction profile can include a deposition time adjustment for the first loop, for the second loop, for the third loop, and so forth, until the final loop. Each adjustment can be applied to a respective deposition step to adjust the thickness of one or more loops or layers such that the film stack thickness is the same as the expected film thickness indicated by the expected profile. For example, if the expected film thickness after loop 39 is of a first value (e.g., 20,000 nm), the expected film thickness after loop 40 is of a second value (e.g., 20,500 nm), and the actual film thickness during a deposition run and after loop 39 is of a third value (e.g., 20,050), the adjustment profile can indicate the correction to the deposition time for loop 40 (e.g., decrease the deposition time for loop 40 by a certain time period) such that the actual film thickness after loop 40 is equal to the expected film thickness (e.g., 20,500 nm).

In some embodiments, the processing logic can generate the correction profile using one or more formulas or mathematical models. For example, the processing logic can use the data values from the expected profile and/or thickness profile to generate a curve fitting model, then use the curve fitting model to determine an offset time value for a particular step during a current deposition process. This aspect of the present disclosure is explained in greater detail in FIG. 5. In some embodiments, the processing logic can generate the correction profile using a machine-learning model (e.g., machine learning model 190) or using an inference engine.

Figure 6:
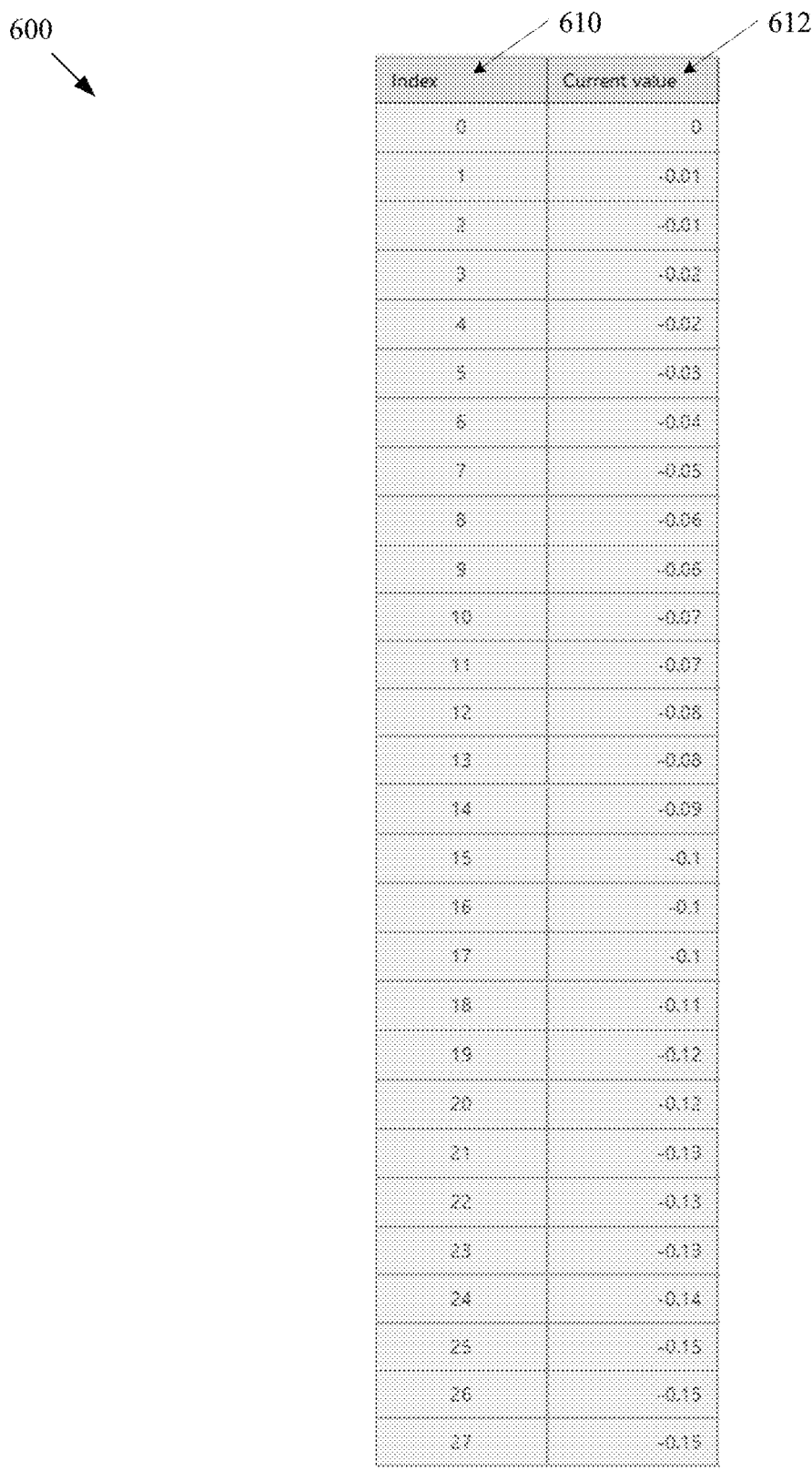
FIG. 6 is a table illustrating an example correction profile, according to certain embodiments.

At operation 418, the processing logic generates an updated process recipe by applying the correction profile to the process recipe. For example, the correction profile can be applied to one or more steps of the current deposition process. FIG. 6 is a table 600 illustrating an example correction profile. As illustrated, column 610 can include an index of loops of a deposition process and column 620 can include a time offset value to be applied to the deposition time of each corresponding loop.

At operation 420, the processing logic performs, on a substrate, a deposition step of the identified process recipe according to the updated process recipe. For example, the processing logic can deposit a first set of film layers (or loops) on the substrate, determine the thickness profile of the deposited film, generate a correction profile to correct any faults detected during the deposition of the first set of film layers, apply the correction profile to the process recipe, and deposit a second set of film layers (or loops) on the substrate. Accordingly, the deposition process recipe can be adjusted in real or near real-time. This process can be repeated for each deposition step of the process recipe.

Figure 5:
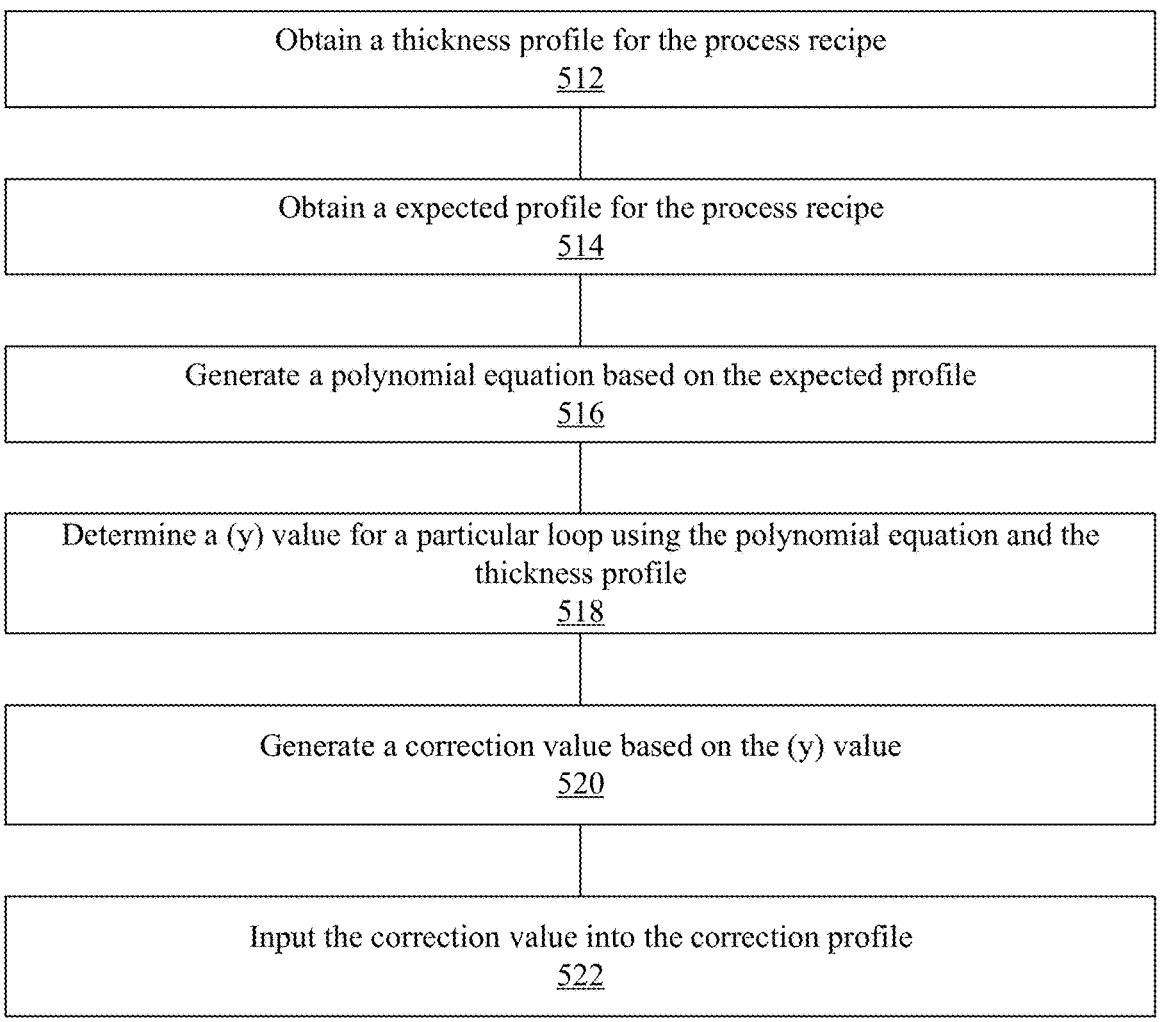
FIG. 5 is a flow chart of a method for determining a correction profile for a process recipe using a curve fitting method, according to certain embodiments.

FIG. 5 is a flow chart of a method 500 for determining a correction profile for a process recipe using a curve fitting method, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by manufacturing equipment 124 and/or client device 122. Although FIG. 5 discusses determining a correction profile using a curve fitting method, those skilled in the art would understand that other methods, formulas, and models can be used to generate a correction profile, including but not limited to, regression analysis, least squares method, etc.

At operation 512, the processing logic obtains a thickness profile for a process recipe. The thickness profile include one or more thickness data values associated with a film generated by the manufacturing equipment 124. For example, the thickness profile can include the measured thickness of the film, the measured thickness of one or more layers of the film, and/or the measured thickness of one or more loops of the film, etc. The thickness profile can be measured using metrology equipment 128. In some embodiments, the thickness profile is retrieved from data store 140.

At operation 514, the processing logic obtains an expected profile for the process recipe. The expected profile can include the desired thickness of the film, the desired thickness of one or more layers of the film, and/or the desired thickness of one or more loops of the film, etc. In some embodiments, the expected profile is retrieved from data store 140.

At operation 516, the processing logic generates a polynomial equation. For example, a polynomial equation with an order of three can be expressed as: $y=ax^3+bx^2+cx+d$, where (x, y) are coordinates and a, b, c, and d are constants. The polynomial equation having an order of three is used by way of example, and a polynomial equation of any order can be used. In some embodiments, the polynomial equation is generated using a set of expected chamber wall residual thickness values as x variables (e.g., the chamber wall residual thickness after loop one, the chamber wall residual thickness after loop two, the chamber wall residual thickness after loop three, and so forth), and time values as y coordinates (e.g., expected deposition thickness at different chamber wall residual thicknesses). The (x, y) values can be retrieved from the expected profile. Using a set of (x, y) coordinates, the constants are determined for the polynomial equation. In some embodiments, chamber wall residue thickness is the season thickness plus the deposition thickness, where deposition thickness equals to the total thickness of all previous loops. A seasoning thickness can include a layer (e.g., silicon oxide layer) over the chamber walls before a substrate is introduced into the chamber for processing. The deposited seasoning layer reducing the likelihood that contaminates will interfere with subsequent processing steps.

At operation 518, the processing logic determines a (y) value for a particular loop using the polynomial equation and the thickness profile. In particular, the processing logic may receive an input (e.g., user based input, automatic input, etc.) indicating a layer or loop of the deposition process. The processing logic can then input the actual thickness for the loop or layer (obtained from the thickness profile) into polynomial equation to calculate the (y) for the loop or layer.

At operation 520, the processing logic generates a correction value based on the (y) value. In one embodiment, the correction value can be generated based on the following equation: Correction Value=(y[first loop]/y[current loop number])*$t_{step}$, where $t_{step}$ is the expected time of the selected loop.

At operation 522, the processing logic inputs the correction value into the correction profile. The operations of method 500 can be performed for one or more of the remaining loops or layers of the process recipe.

Figure 7A:
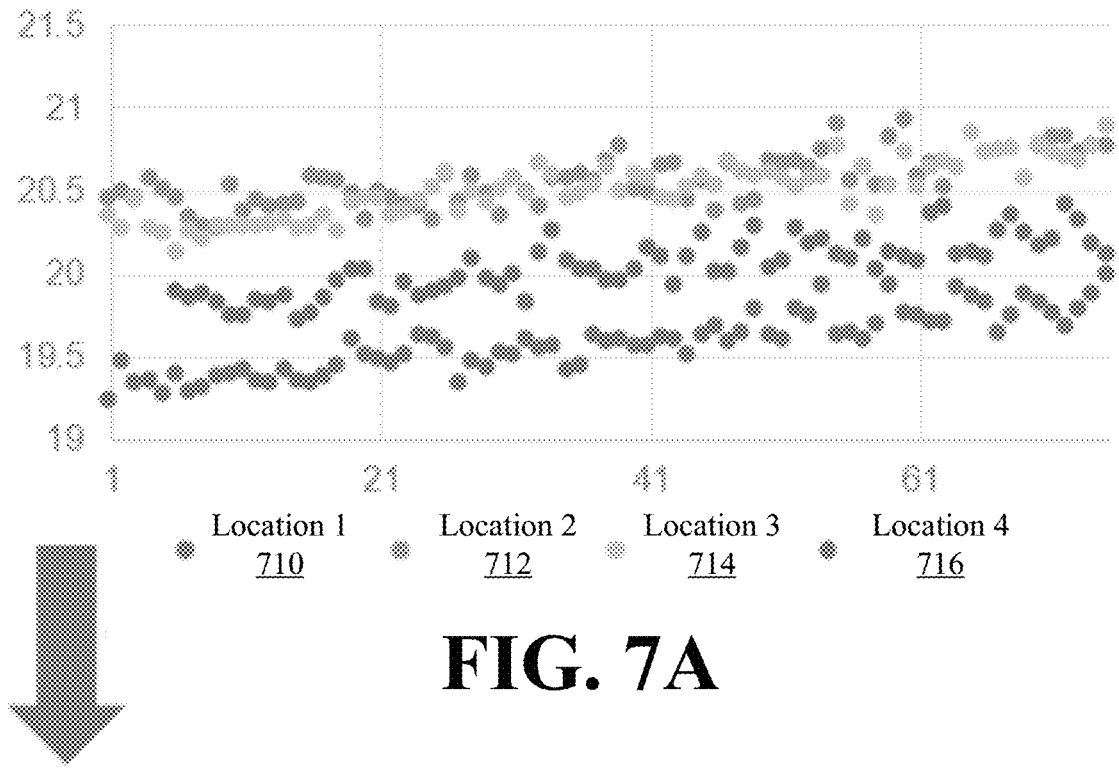
FIGS. 7A-7B are graphs illustrating metrology data from deposition processes, according to aspects of the present disclosure.
Figure 7B:
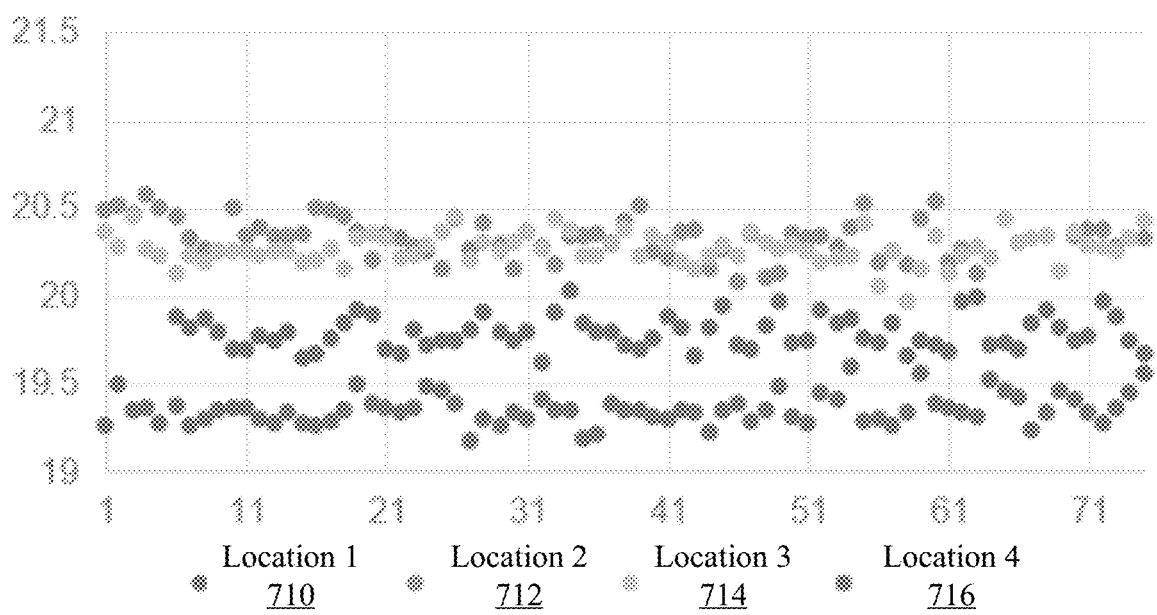

FIG. 7A-7B are graphs illustrating metrology data from deposition processes according to the same recipe, according to aspects of the present disclosure. In particular, FIG. 7A is a graph showing thickness values (expressed along the y-axis) of a set of loops (expressed along the x-axis) for from four different locations (locations 710-716) along a substrate. The thickness values of each loops shown in FIG. 7A are not adjusted according to a correction profile. As seen, the thickness of each loop gradually increases. FIG. 7B is a graph showing thickness values of each loop as adjusted according to a correction profile. As seen, the thickness of each loop stay relatively the same throughout the deposition process and does not gradually increase.

Figure 8:
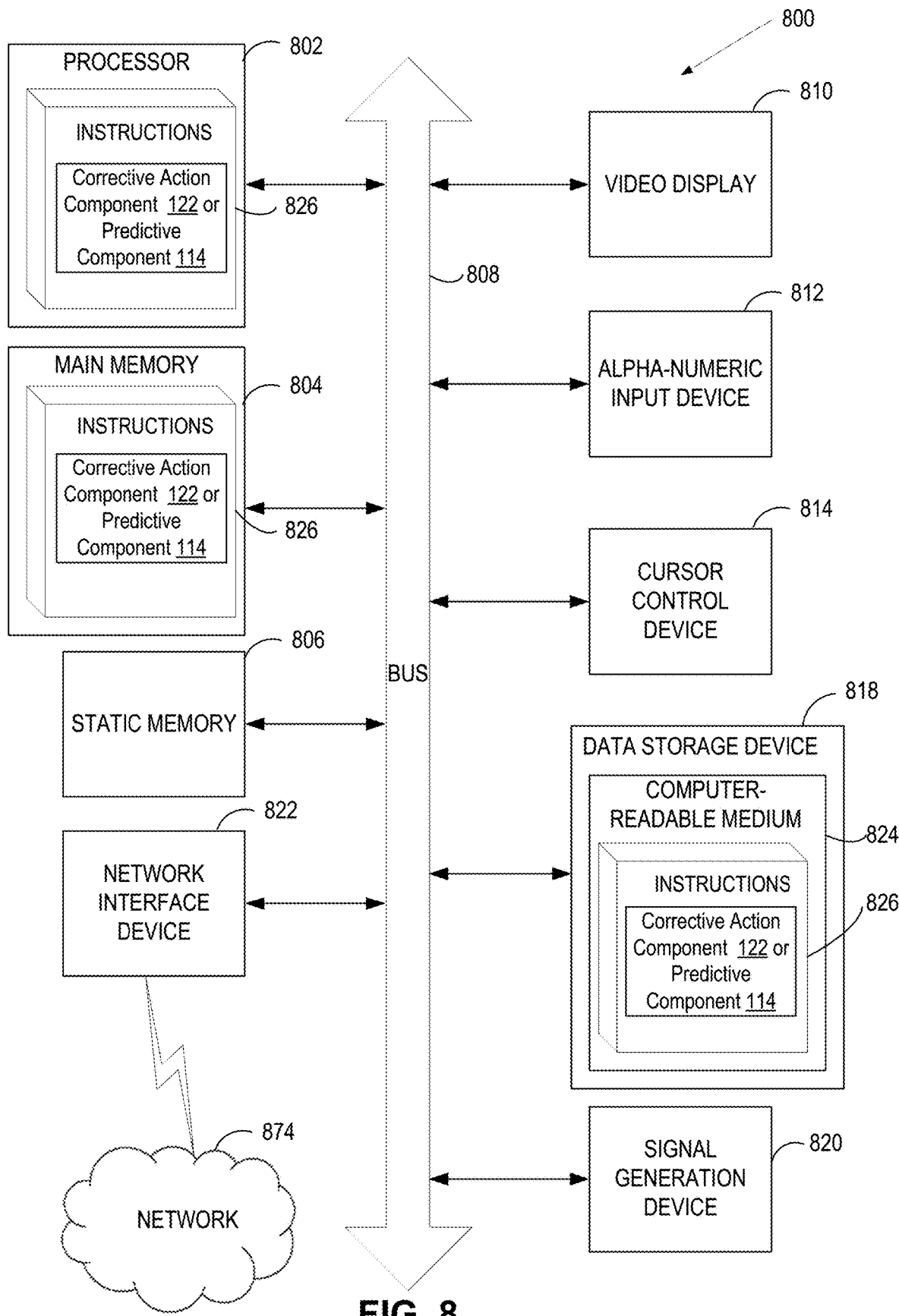
FIG. 8 is a block diagram illustrating a computer system, according to certain embodiments.

FIG. 8 is a block diagram illustrating a computer system 800, according to certain embodiments. In some embodiments, computer system 800 can be connected (e.g., via a network, such as a Local Area Network (LAN), an intranet, an extranet, or the Internet) to other computer systems. Computer system 800 can operate in the capacity of a server or a client computer in a client-server environment, or as a peer computer in a peer-to-peer or distributed network environment. Computer system 800 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 can include a processing device 802, a volatile memory 804 (e.g., Random Access Memory (RAM)), a non-volatile memory 806 (e.g., Read-Only Memory (ROM) or Electrically-Erasable Programmable ROM (EEPROM)), and a data storage device 816, which can communicate with each other via a bus 808.

Processing device 802 can be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 800 can further include a network interface device 822 (e.g., coupled to network 874). Computer system 800 also can include a video display unit 810 (e.g., an LCD), an alphanumeric input device 812 (e.g., a keyboard), a cursor control device 814 (e.g., a mouse), and a signal generation device 820.

In some implementations, data storage device 816 can include a non-transitory computer-readable storage medium 824 on which can store instructions 826 encoding any one or more of the methods or functions described herein, including instructions encoding components of FIG. 1 (e.g., corrective action component 122, predictive component 114, etc.) and for implementing methods described herein.

Instructions 826 can also reside, completely or partially, within volatile memory 804 and/or within processing device 802 during execution thereof by computer system 800, hence, volatile memory 804 and processing device 802 can also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and can not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:
   causing a first deposition operation of a plurality of deposition operations to be performed on a substrate according to a process recipe;
   obtaining metrology data associated with a first set of layers formed by the first deposition operation;
   obtaining an expected profile associate with the process recipe, wherein the expected profile comprises a plurality of values indicative of a desired thickness for a plurality of layers of the process recipe;
   generating a correction profile based on the metrology data and the expected profile, wherein the correction profile comprises a deposition time offset value for at least one layer of the plurality of layers;
   generating an updated process recipe by applying the correction profile to the process recipe; and causing a second deposition operation of the plurality of deposition operations to be performed on the substrate according to the updated process recipe, wherein the second deposition operation forms a second set of layers on the first set of layers.

2. The method of claim 1, wherein the metrology data is indicative of an actual thickness of one or more deposited layers.

3. The method of claim 1, wherein the correction profile further comprises one or more corrective actions to be applied to one or more setting parameters of the process recipe.

4. The method of claim 1, wherein generating the correction profile comprises:
generating a polynomial equation based on at least one of the metrology data or the expected profile; and
determining one or more deposition time offset values using the polynomial equation.

5. The method of claim 1, wherein generating the correction profile comprises:
inputting the metrology data into a trained machine-learning model; and
obtaining an output value of the trained machine-learning model, wherein the output value is indicative of the correction profile.

6. The method of claim 1, wherein the correction profile comprises a deposition time offset value for a pair of layers comprising different materials.

7. The method of claim 1, wherein the deposition time offset value causes an actual film stack thickness generated according to the process recipe to match an expected film stack thickness generated according to the process recipe.

8. An electronic device manufacturing system, comprising:
a memory device; and
a processing device, operatively coupled to the memory device, to perform operations comprising:
causing a first deposition operation of a plurality of deposition operations to be performed on a substrate according to a process recipe
obtaining metrology data associated with a first set of layers formed by the first deposition operation;
obtaining an expected profile associate with the process recipe, wherein the expected profile comprises a plurality of values indicative of a desired thickness for a plurality of layers of the process recipe;
generating a correction profile based on the metrology data and the expected profile, wherein the correction profile comprises a deposition time offset value for at least one layer of the plurality of layers;
generating an updated process recipe by applying the correction profile to the process recipe; and
causing a second deposition operation of the plurality of deposition operations to be performed on the substrate according to the updated process recipe, wherein the second deposition operation forms a second set of layers on the first set of layers.

9. The electronic device manufacturing system of claim 8, wherein the metrology data is indicative of an actual thickness of one or more deposited layers.

10. The electronic device manufacturing system of claim 8, wherein the correction profile further comprises one or more corrective actions to be applied to one or more setting parameters of the process recipe.

11. The electronic device manufacturing system of claim 8, wherein generating the correction profile includes the processing device performing operations comprising:
generating a polynomial equation based on at least one of the metrology data or the expected profile; and
determining one or more deposition time offset values using the polynomial equation.

12. The electronic device manufacturing system of claim 8, wherein generating the correction profile includes the processing device performing operations comprising:
inputting the metrology data into a trained machine-learning model; and
obtaining an output value of the trained machine-learning model, wherein the output value is indicative of the correction profile.

13. The electronic device manufacturing system of claim 8, wherein the correction profile comprises a deposition time offset value for a pair of layers comprising different materials.

14. The electronic device manufacturing system of claim 8, wherein the deposition time offset value causes an actual film stack thickness generated according to the process recipe to match an expected film stack thickness generated according to the process recipe.

15. A non-transitory computer-readable storage medium comprising instructions that, when executed by a processing device operatively coupled to a memory, performs operations comprising:
causing a first deposition operation of a plurality of deposition operations to be performed on a substrate according to a process recipe
obtaining metrology data associated with a first set of layers formed by the first deposition operation;
obtaining an expected profile associate with the process recipe, wherein the expected profile comprises a plurality of values indicative of a desired thickness for a plurality of layers of the process recipe;
generating a correction profile based on the metrology data and the expected profile, wherein the correction profile comprises a deposition time offset value for at least one layer of the plurality of layers;
generating an updated process recipe by applying the correction profile to the process recipe; and
causing a second deposition operation of the plurality of deposition operations to be performed on the substrate according to the updated process recipe, wherein the second deposition operation forms a second set of layers on the first set of layers.

16. The non-transitory computer-readable storage medium of claim 15, wherein the metrology data is indicative of an actual thickness of one or more deposited layers.

17. The non-transitory computer-readable storage medium of claim 15, wherein the correction profile further comprises one or more corrective actions to be applied to one or more setting parameters of the process recipe.

18. The non-transitory computer-readable storage medium of claim 17, wherein generating the correction profile includes performing operations comprising:
generating a polynomial equation based on at least one of the metrology data or the expected profile; and
determining one or more deposition time offset values using the polynomial equation.

19. The non-transitory computer-readable storage medium of claim 17, wherein generating the correction profile includes performing operations comprising:
inputting the metrology data into a trained machine-learning model; and
obtaining an output value of the trained machine-learning model, wherein the output value is indicative of the correction profile.

20. The non-transitory computer-readable storage medium of claim 17, wherein the correction profile comprises a deposition time offset value for a pair of layers comprising different materials.

\* \* \* \* \*